United States Patent
Ho et al.

(10) Patent No.: US 8,037,593 B2
(45) Date of Patent: Oct. 18, 2011

(54) METHOD FOR MANUFACTURING AN ULTRA NARROW GAP MAGNETORESISTIVE SENSOR

(75) Inventors: Kuok San Ho, Redwood City, CA (US); Ying Hong, Morgan Hill, CA (US); Wipul Pemsiri Jayasekara, Los Gatos, CA (US); Daniele Mauri, San Jose, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 683 days.

(21) Appl. No.: 11/966,106

(22) Filed: Dec. 28, 2007

(65) Prior Publication Data

US 2009/0165286 A1    Jul. 2, 2009

(51) Int. Cl.
G11B 5/127    (2006.01)
H04R 31/00    (2006.01)

(52) U.S. Cl. .............. 29/603.01; 29/603.07; 29/603.13; 29/603.14; 360/324.1; 360/324.11; 438/3

(58) Field of Classification Search .............. 29/603.01, 29/603.07, 603.11, 603.13, 603.14; 360/324.1, 360/324.11, 324.12, 324.2; 438/3, 257, 710, 438/712, 722
See application file for complete search history.

(56) References Cited

U.S. PATENT DOCUMENTS

| | | | |
|---|---|---|---|
| 6,452,385 B1 | 9/2002 | Shimazawa et al. | 324/252 |
| 6,731,477 B2 | 5/2004 | Lin et al. | 360/324.1 |
| 6,747,852 B2 * | 6/2004 | Lin et al. | 360/324.12 |
| 6,791,320 B2 | 9/2004 | Hasegawa et al. | 324/252 |
| 6,919,280 B2 | 7/2005 | Hsiao et al. | 438/710 |
| 6,947,263 B2 | 9/2005 | Saito | 360/324.12 |
| 7,005,242 B2 | 2/2006 | Jayasekara | 430/320 |
| 7,023,670 B2 * | 4/2006 | Saito | 360/324.12 |
| 7,050,276 B2 | 5/2006 | Nishiyama | 360/324.11 |
| 7,075,759 B2 | 7/2006 | Hasegawa et al. | 360/324.12 |
| 7,112,861 B2 | 9/2006 | Kanakasabapathy et al. | 257/421 |
| 7,211,447 B2 * | 5/2007 | Horng et al. | 438/3 |
| 2005/0219773 A1 | 10/2005 | Li et al. | 360/324.12 |
| 2006/0209471 A1 | 9/2006 | Nagasaka et al. | 360/324.1 |
| 2006/0211198 A1 | 9/2006 | Horng et al. | 438/257 |
| 2006/0245116 A1 | 11/2006 | Klostermann et al. | 360/324.2 |

FOREIGN PATENT DOCUMENTS

| | | |
|---|---|---|
| JP | 2004253593 | 9/2004 |
| JP | 2006190780 | 7/2006 |

OTHER PUBLICATIONS

Yen et al., "Improvement of Switching Field in Magnetic Tunneling Junction Using Ru/Ta Capping Layer" IEEE Transactions on Magnetics, vol. 42, No. 10, Oct. 2006.
Tezuka et al., "CPP-GMR Enhancement in Spin Valves Using a Thin Ru Layer" Journal of Magnetism and Magnetic Materials 290-291 (2005) 1150-1153.

* cited by examiner

Primary Examiner — Thiem Phan
(74) Attorney, Agent, or Firm — Zilka-Kotab, PC

(57) ABSTRACT

A method for manufacturing a magnetoresistive sensor that decreases the stack height of the sensor. The method includes forming a sensor structure having at its top, a Ru layer and a Ta layer over the Ru layer. An annealing process is performed to set the magnetization of the pinned layer of the sensor structure. After the annealing process has been completed and the Ta layer is no longer needed, an ion milling process is performed to remove the Ta layer.

11 Claims, 8 Drawing Sheets

METHOD FOR MANUFACTURING AN ULTRA NARROW GAP MAGNETORESISTIVE SENSOR

FIELD OF THE INVENTION

The present invention relates to magnetoresistive sensors and more particularly to a sensor having a reduced gap thickness for increased data density.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos θ, where θ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

The need for ever increased data density is pushing researches to develop data recording systems that can read and record ever smaller bit lengths in order to increase the density of data recorded on a magnetic medium. This has led a push to decrease the gap size of a read head such as a GMR head. However, the amount by which such gap lengths can be decreased using conventional GMR heads has limitations. For example, physical requirements of the various layers making up a magnetoresistive sensor have certain physical requirements that limit the amount by which they can be made thinner. Therefore, there is a strong felt need for a method for manufacturing a magnetoresistive sensor that can overcome these limitations and to produce a sensor having a reduced gap thickness, thereby increasing data density.

In addition, researchers have worked to develop current perpendicular to plane (CPP) magnetoresistive sensors. Such sensors are constructed such that the sense current travels perpendicular to the plane of the sensor layers, rather than parallel with the planes of the sensors. Examples of such CPP sensors include current perpendicular to plane giant magnetoresistive sensors (CPP GMR sensors) and tunnel valve sensors. A tunnel valve sensor operates based on the spin dependent tunneling of electrons through a thin, electrically insulating barrier layer.

SUMMARY OF THE INVENTION

The present invention provides a method for manufacturing a magnetoresistive sensor having a reduced gap thickness for increased data density and improved linear resolution. The method involves forming a sensor stack having a layer of Ru and a layer of Ta formed at the top of the sensor stack. An annealing process is performed to set a magnetization of the pinned layer, and then, after the annealing has been completed, an ion milling process is used to remove the Ta layer.

The method for manufacturing a sensor significantly decreases the stack height of the sensor by eliminating the Ta layer after it is no longer needed to achieve desired sensor properties. All or a portion of the Ru layer remains so that the free layer will not be exposed, which would destroy the free layer and render the sensor inoperable.

The reduced sensor stack height advantageously improves linear resolution. In addition, the decreased stack height improves data density by allowing the sensor to read a shorter data bit, thereby allowing more data bits to fit onto a magnetic medium.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
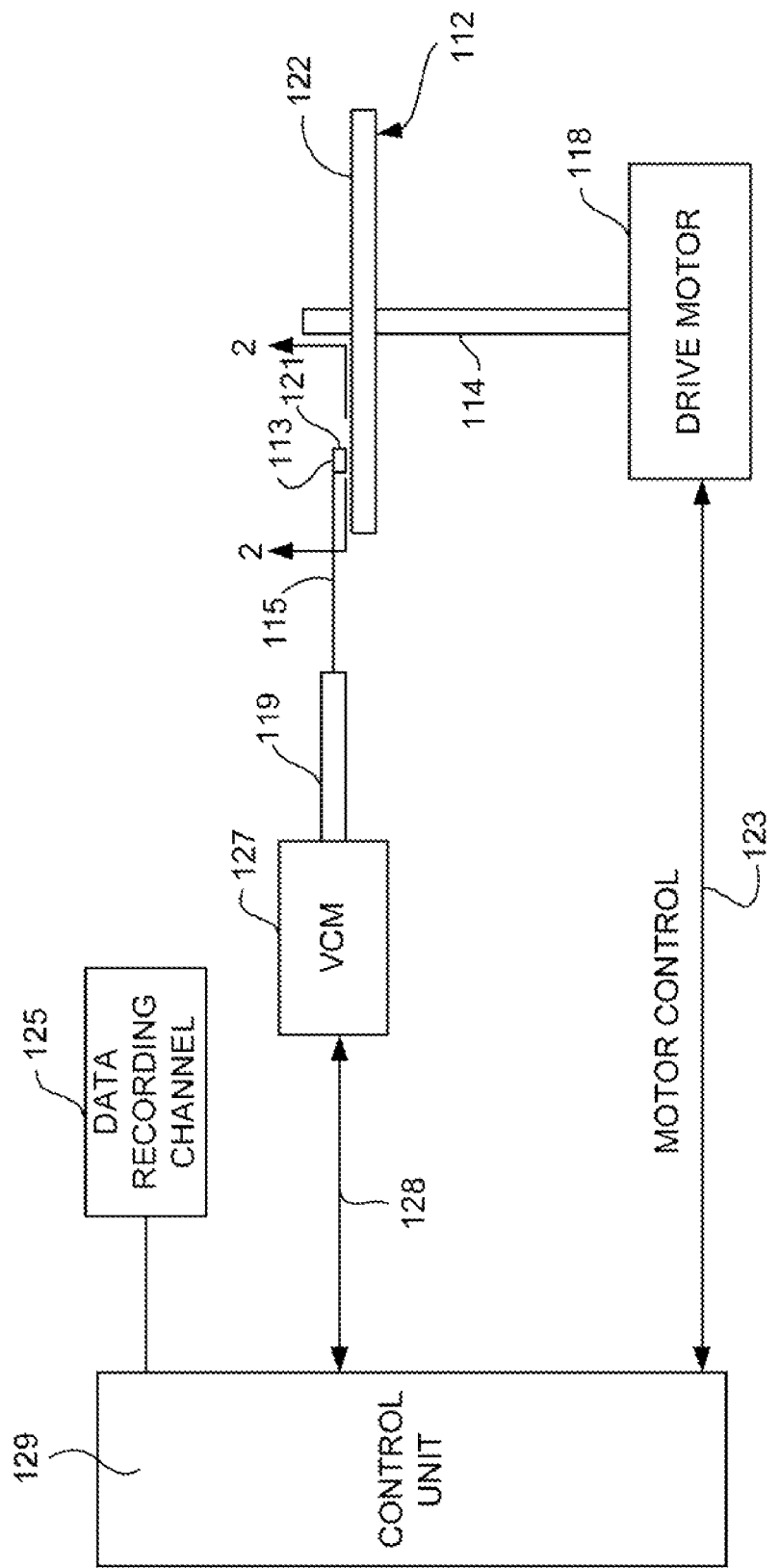
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
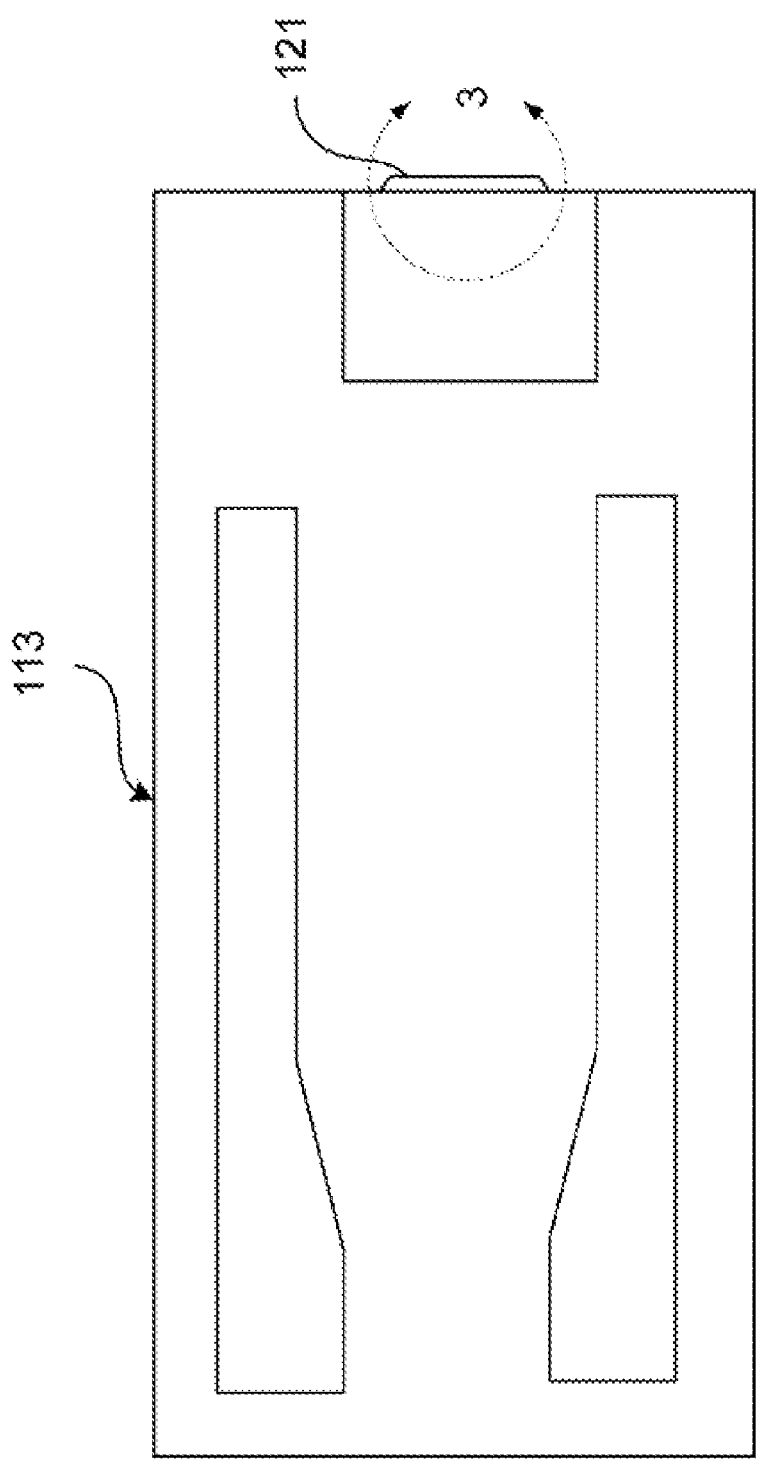
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
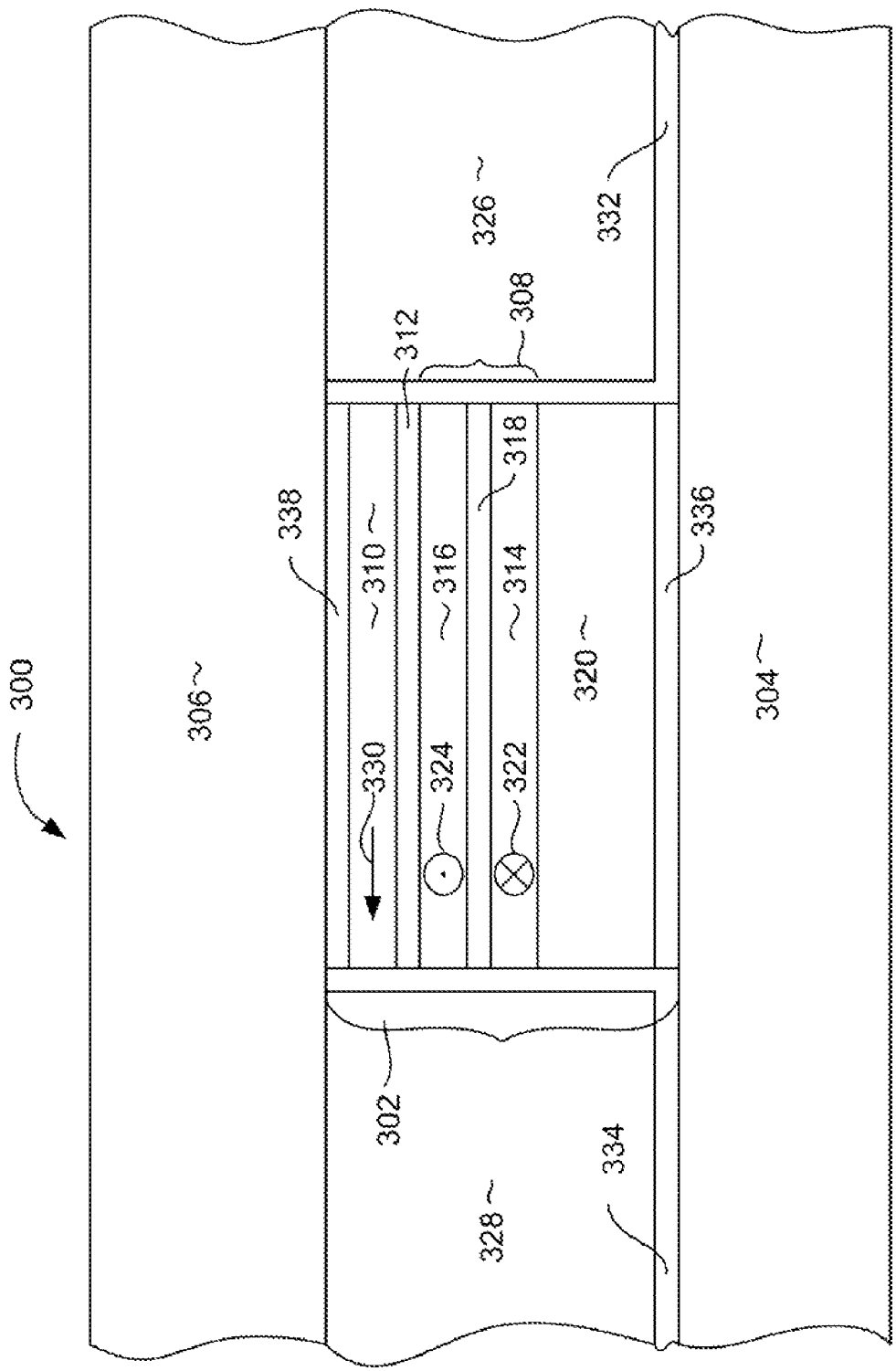
FIG. 3 is an enlarged ABS view taken from circle 3 of FIG. 2 rotated 90 degrees counterclockwise.

With reference now to FIG. 3, a magnetoresistive sensor 300 according to an embodiment of the invention includes a sensor stack 302 that is sandwiched between first and second non-magnetic, electrically conductive lead layers 304, 306. The sensor 300 described with reference to FIG. 3 is being described as current perpendicular to plane (CPP) sensor. However, the sensor 300 could be embodied in a current in plane sensor, in which case the sensor stack 302 would be sandwiched between first and second electrically insulating gap layers 304, 306.

The sensor stack 302 includes a magnetic pinned layer structure 308 and a magnetic free layer structure 310. The sensor 300 can be a giant magnetoresistive sensor (GMR) in which case a non-magnetic, electrically conductive spacer layer 312 would be sandwiched between the pinned layer structure 308 and the free layer structure 310. In that case the spacer layer 312 could be constructed of a material such as Cu or CuO. On the other hand, the sensor 300 could be a tunnel magnetoresistive sensor (TMR), in which case the layer 312 would be a non-magnetic, electrically insulating barrier layer, constructed of a material such as MgO, TiO or $Al_2O_3$.

The pinned layer structure 308 can be constructed as an antiparallel coupled pinned layer structure (AP pinned structure), which can include first and second magnetic layers 314, 316, constructed of a material such as CoFe, with a thin, non-magnetic, antiparallel coupling layer 318 such as Ru sandwiched between the first and second magnetic layers 314, 316. The first magnetic layer 314 of the pinned layer structure 308 is formed over and exchange coupled with a layer of antiferromagnetic material (AFM layer) 320. The exchange coupling with the AFM layer 320 pins the magnetization of the first magnetic layer 314 in a direction perpendicular to the air bearing surface (ABS) as indicated by arrow-tail 322. Antiparallel coupling between the first and second magnetic layers 314, 316 pins the magnetic moment in a direction opposite to that of the first magnetic layer 314 as indicated by arrow-head 324.

With reference still to FIG. 3, first and second hard magnetic bias layers 326, 328 formed at either side of the sensor stack 302 provide a magnetic bias field that biases the magnetization of the free layer structure 310 in a direction parallel with the ABS as indicated by arrow 330. The hard bias layers 326, 328 can be constructed of, for example, CoPt or CoPtCr. Electrically insulating layers 332, 334 separate each of the hard bias layers 326, 328 from the sensor stack 302 and from one of the leads 304 in order to prevent sense current from being shunted through the bias layers 326, 328. The insulation layers 332, 334 can be constructed of an electrically insulating material such as conformally deposited alumina. The sensor 300 can also include a seed layer 336 formed at the bottom of the sensor stack 302. The seed layer is constructed of a material that promotes a desired grain structure in the layers deposited thereover.

With continued reference to FIG. 3, the sensor stack 302 includes a capping layer 338, preferably constructed of Ru formed at the top of the sensor stack 302. The Ru capping layer 338 has a reduced thickness, due to a novel thickness reduction process to be described below. For example, the capping layer can have a thickness of 2-5 nm or preferably about 3 nm. The reduced thickness of the capping layer 338 significantly reduces the gap thickness by decreasing the overall stack height ST of the sensor stack 302.

Figure 4:
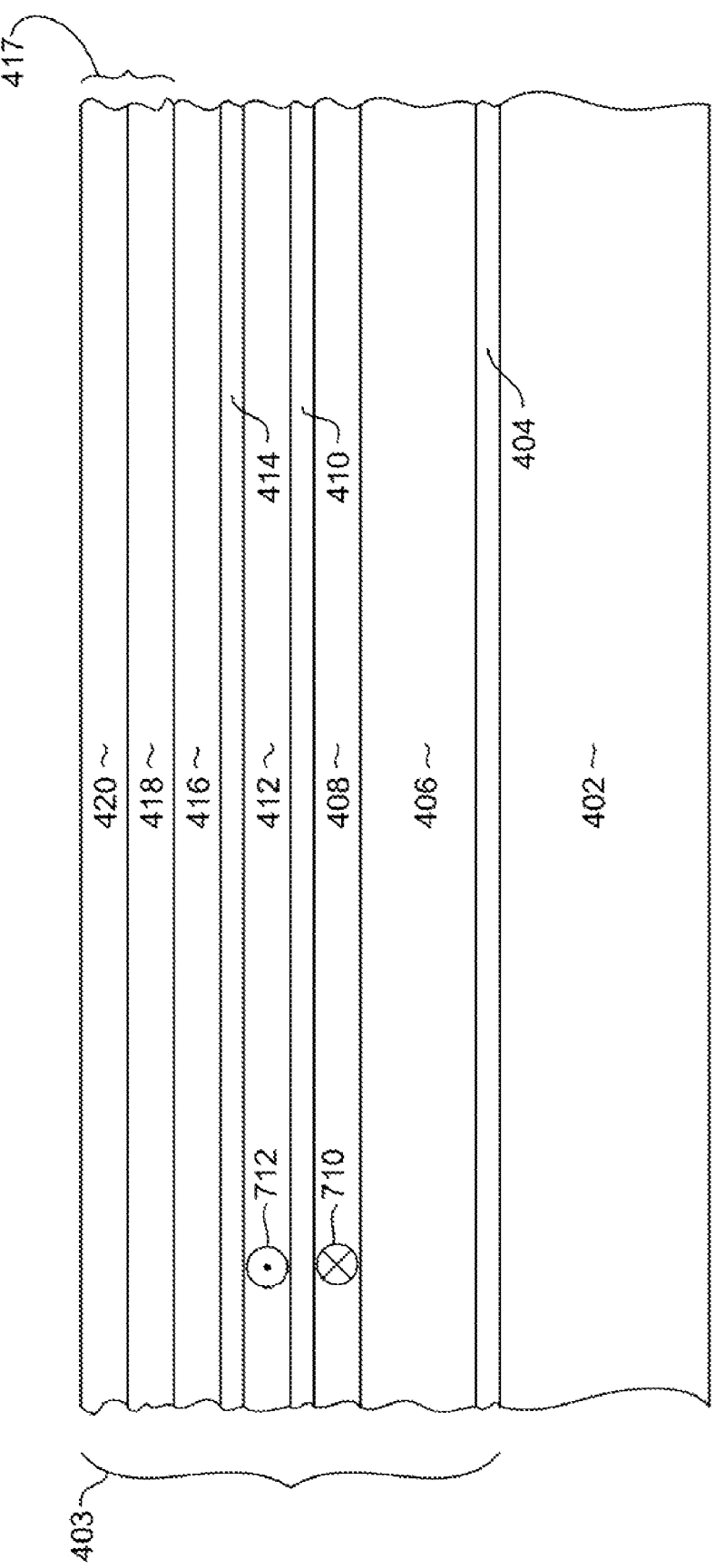
FIGS. 4-8 are ABS views showing a sensor in various intermediate stages of manufacture in order to illustrate a method of manufacturing a magnetoresistive sensor according to an embodiment of the invention.

With reference now to FIGS. 4-8, a method for manufacturing a sensor according to an embodiment of the invention is described. With particular reference to FIG. 4, a substrate

402 is provided. In the case of a current perpendicular to plane (CPP) sensor, the substrate is a non-magnetic, electrically conductive lead layer. If the sensor is to be a current in plane (CIP) sensor, then the substrate 402 will be an electrically insulating gap layer.

A plurality of sensor layers 403 including a novel capping structure 417 deposited over the substrate 402. The sensor layers can include: a seed layer 404; a layer of antiferromagnetic material; a first magnetic pinned layer (AP1) layer 408; a non-magnetic AP coupling layer 410; a second magnetic pinned layer (AP2); a non-magnetic, electrically conductive spacer layer, or non-magnetic electrically insulating barrier layer 414; and a magnetic free layer structure 416. The sensor layers 403 also include a novel bi-layer capping layer structure 417 that includes a first layer of Ru 418 and a layer of Ta 420. The Ru layer 418 can have a thickness of 5-15 nm as deposited or preferably about 10 nm as deposited. The Ta layer 420 can have a thickness of 1-5 nm as deposited or preferably about 3 nm as deposited.

In order to set the magnetizations of the pinned layers 408, 412, an annealing step must be performed. This annealing step involves heating the sensor to a temperature above the blocking temperature of the AFM layer 406, exposing the sensor to a strong magnetic field and then cooling the sensor. For example, if the AFM layer comprises IrMn, the sensor is heated to a temperature of about 240 C. to 280 C. While the sensor is heated to this temperature, a magnetic field of about 50000 Oe is applied in a direction perpendicular to the ABS (i.e. into or out of the page in FIG. 4). This magnetic field is sufficiently strong to overcome the antiparallel coupling between the magnetic layers 408, 412 so that, at this point, their magnetizations are oriented in the same direction perpendicular to the ABS. While this magnetic field is maintained, the sensor is cooled. When the sensor is cooled below the blocking temperature of the AFM layer 406, exchange coupling between the AFM layer 406 and the first magnetic layer 408 keeps the magnetization of the first magnetic layer pinned in a direction oriented perpendicular to the ABS as indicated by arrow-tail 710. When the magnetic field is removed, antiparallel coupling between the magnetic layers 408, 412 across the AP coupling layer 410 causes the second magnetic layer 412 to have its magnetization pinned in a direction opposite to the magnetization 710 of the first magnetic layer 408 as indicated by arrow-head 712.

This annealing step is necessary for proper sensor operation, however, the free magnetic layer 416 must be protected during this high temperature anneal. To this end, the Ru layer 418, and Ta layer 420 protect the free layer 416 during the high temperature anneal. The Ta layer 420 is necessary during this high temperature anneal to achieve desired free layer properties such as low magnetostriction.

However, as mentioned above, it is necessary to reduce the stack height of the sensor as much as possible in order to reduce bit length and also to increase the linear resolution of the sensor. Once the annealing has been completed and the sensor has cooled, the Ta layer 420 is no longer needed. The Ru layer 418 is, however, needed in order to prevent the sensor from oxidizing, and being otherwise destroyed.

Therefore, in order to significantly reduce the stack height of the sensor, a material removal process such as an ion milling is performed to remove the Ta layer 420 using end point detection to stop the ion milling at the Ru layer 418. An end point detection method such as Secondary Ion Mass Spectroscopy (SIMS) can be used to detect when the Ru layer 418 has been reached. A portion of the Ru layer 418 can be removed during this ion milling, so long as some Ru layer 418 remains. For example, if the Ru layer 418 was originally deposited to a thickness of about 10 nm, about 2-7 nm of the Ru layer 418 can be removed leaving a Ru layer 418 having a thickness of about 3-8 nm.

Figure 5:
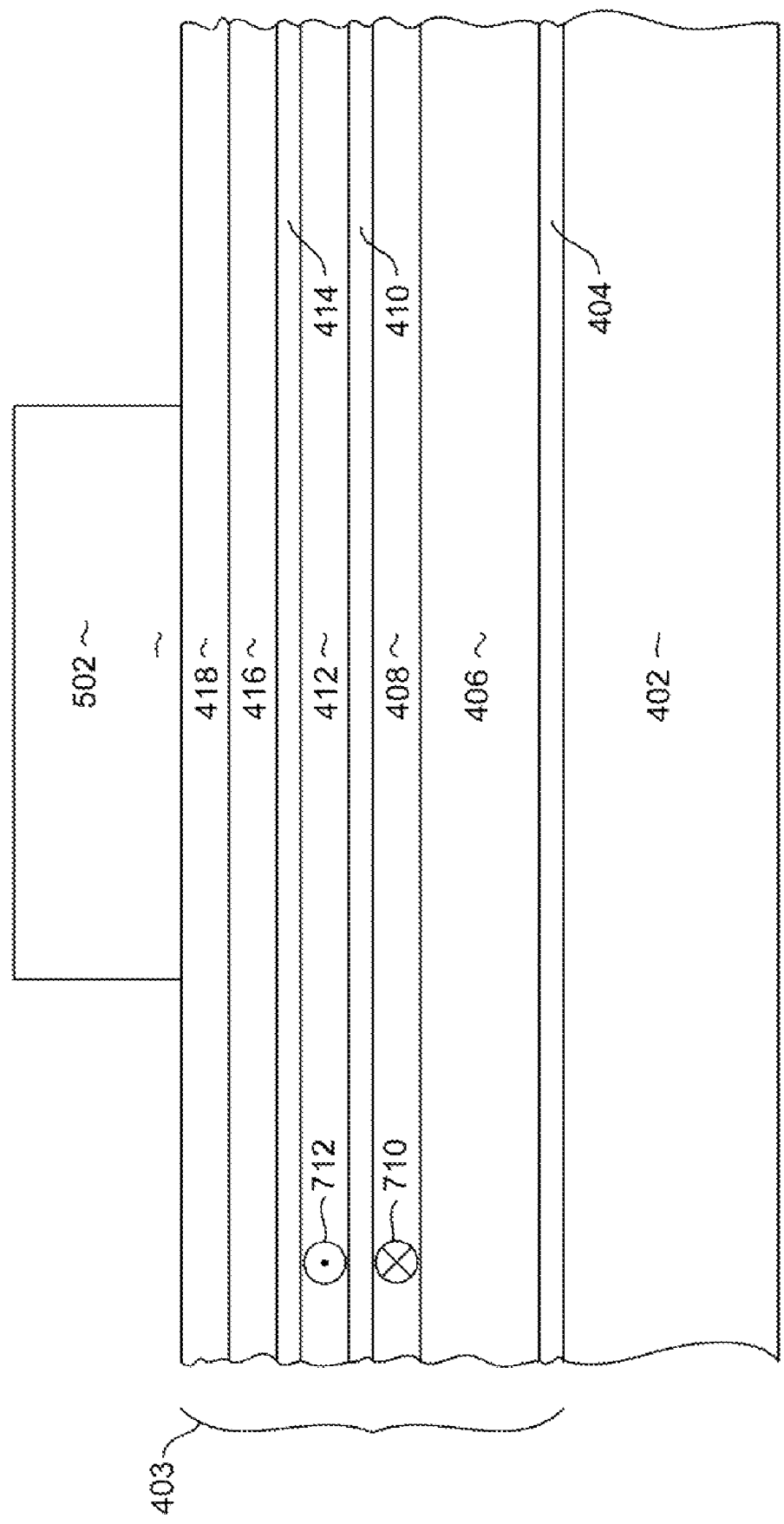
Figure 6:
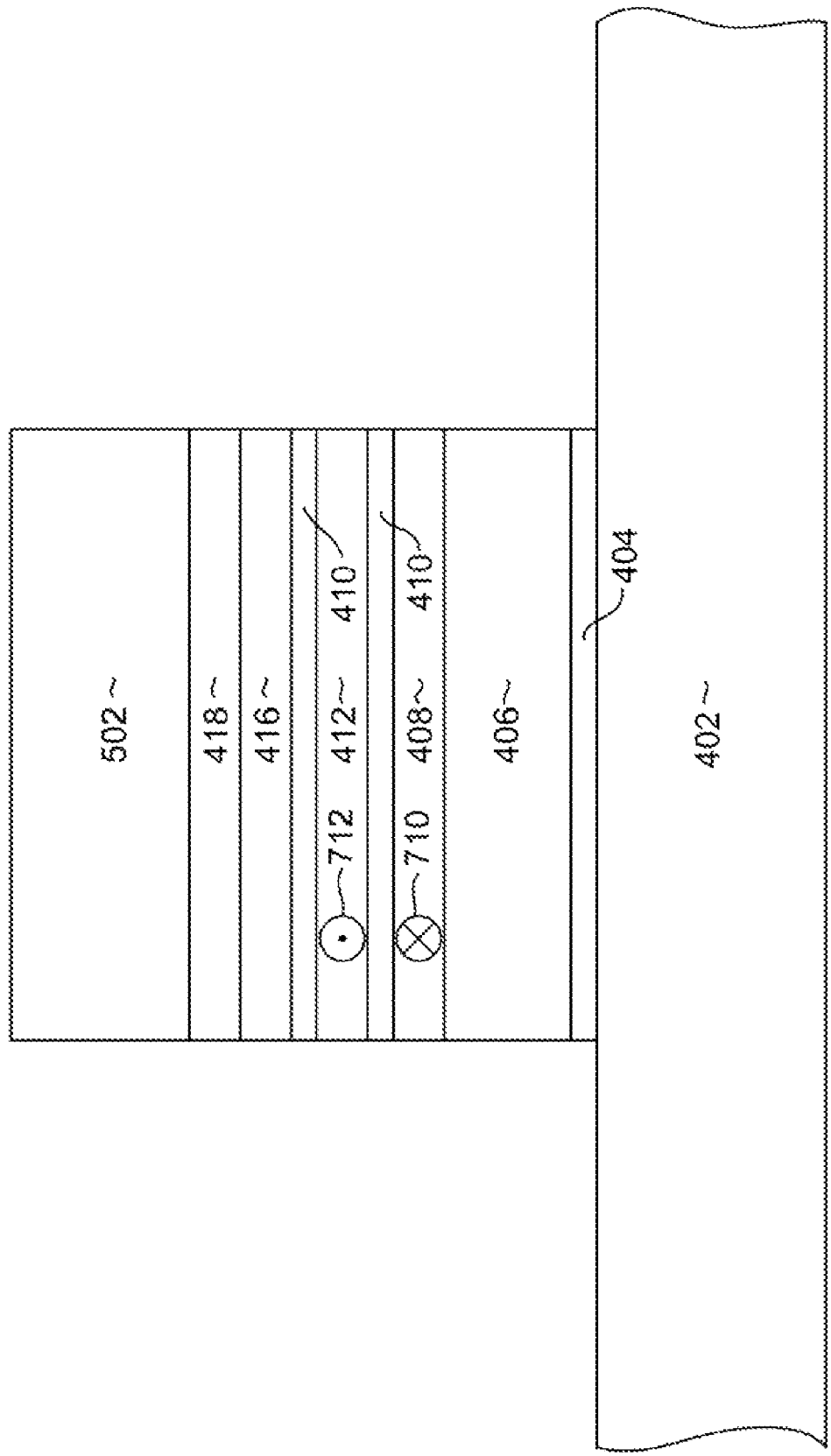

With continued reference to FIG. 5, a mask structure 502 is formed over the sensor layers 403. As can be seen, the Ru layer 420, shown above in FIG. 4, has been removed. The mask structure 502 can include a photoresist layer that has been photo lithographically patterned and developed to have a width configured to define a sensor width. Then, with reference to FIG. 6 a material removal process such as ion milling is performed to remove portions of the sensor layers that are not protected by the mask structure 502 to define a sensor width. A second mask and second ion milling step (not shown) can be performed to define a stripe height of the sensor, which is the distance from the ABS to the back edge of the sensor. Also, the order of these masking and milling steps can be reversed so that the stripe height is defined first and then the track width.

Figure 7:
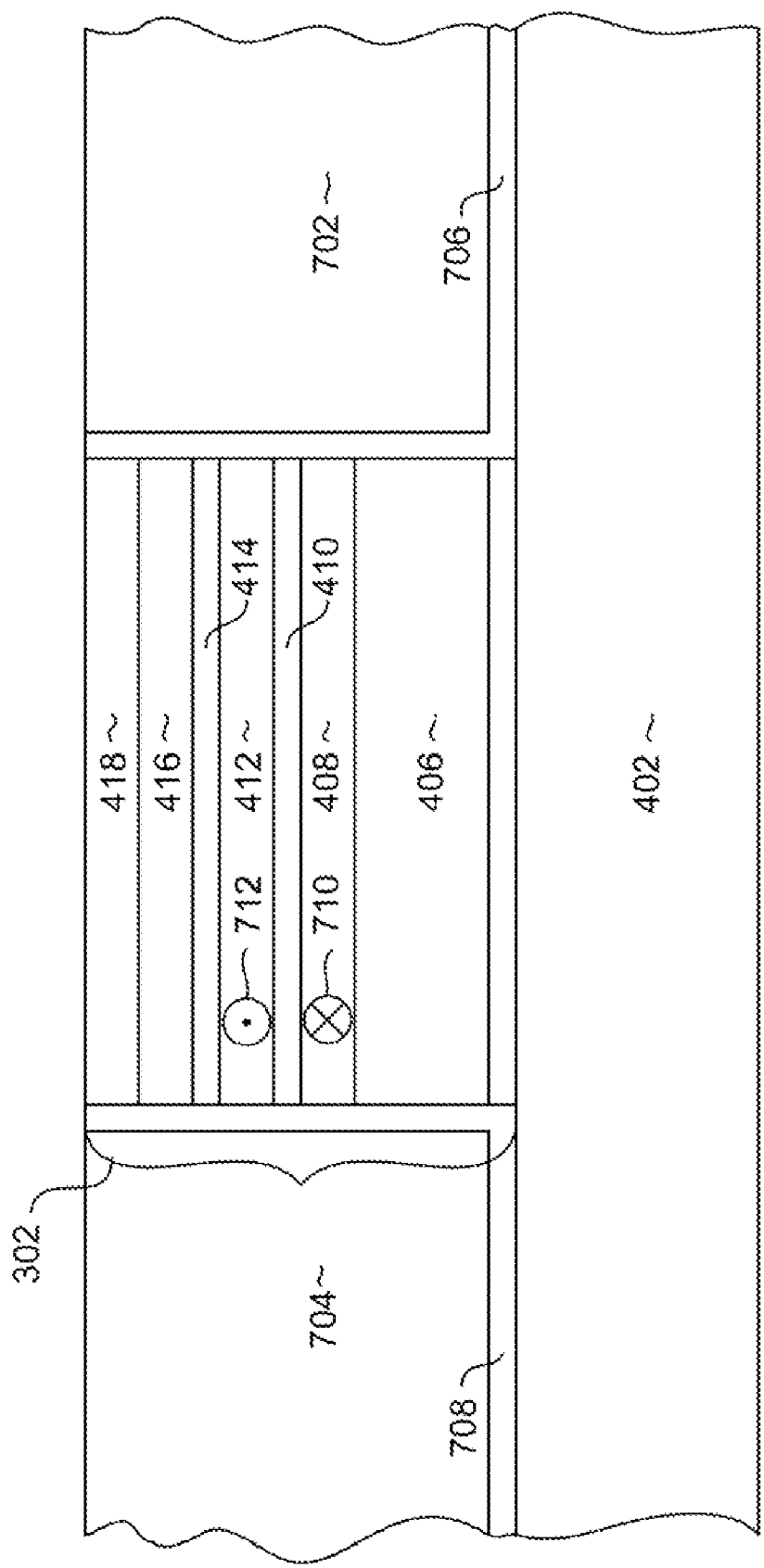

With reference now to FIG. 7, (if the sensor is to be a current perpendicular to plane sensor) an electrically insulating material such as alumina is deposited, preferably by a conformal deposition method such as atomic layer deposition (ALD) to form insulation layers 706, 708. Then, a magnetically hard material such as CoPt and or CoPtCr is deposited to form magnetic hard bias layers 702, 704 at the sides of a portion the sensor stack layers 302. The mask can then be lifted off leaving a structure as shown in FIG. 7.

Figure 8:
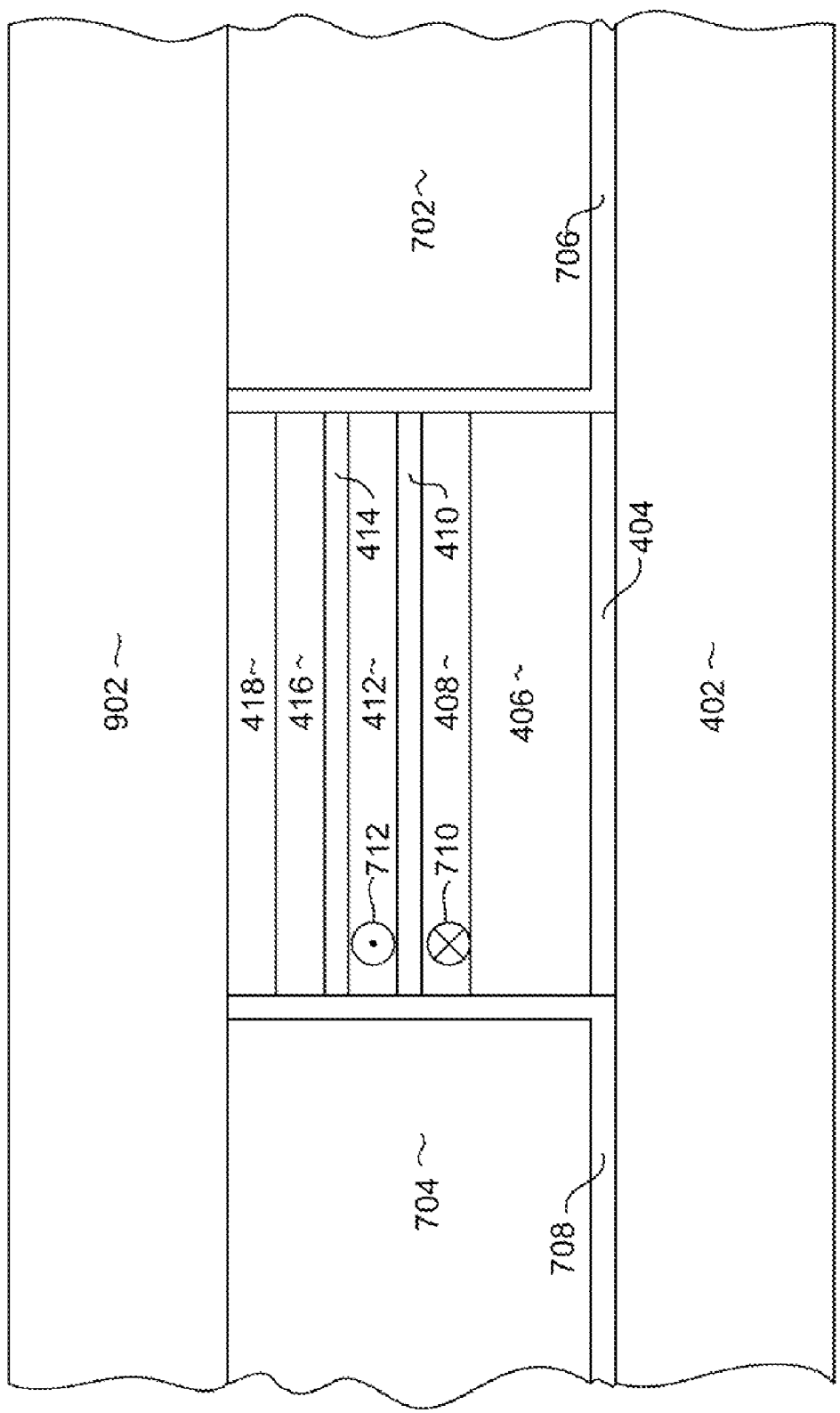

With reference now to FIG. 8, a second or top electrically conductive lead layer 902 can be formed. If the invention is embodied in a Current In Plane (CIP) GMR sensor, the layer 902 would be an electrically insulating gap layer. In that case, the insulation layers 706, 708 would not be included, and electrically conductive lead layers (not shown) would be formed over each of the hard bias layers 702, 704.

The above described process significantly reduces the stack height of the sensor, by eliminating the Ta capping layer 420 (FIG. 4) after it is no longer needed. As discussed above, this increases data density and also improves linear signal resolution.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for manufacturing a magnetoresistive sensor, comprising:
   providing a substrate;
   depositing a plurality of sensor layers over the substrate, the plurality of sensor layers including a capping layer structure formed at the top of the plurality of sensor layers, the capping layer including a layer of Ru and a layer of Ta formed over the layer of Ru;
   performing an annealing process;
   after performing the annealing process, performing an ion milling to remove all of the layer of Ta; and
   after performing the ion milling to remove all of the layer of Ta, defining a sensor structure from the plurality of sensor layers.

2. The method as in claim 1 wherein the Ta layer is deposited to a thickness of 1-5 nm.

3. The method as in claim 1 wherein the Ta layer is deposited to a thickness of 1-5 nm and the Ru layer is deposited to a thickness of 5-15 nm.

4. The method as in claim 1 wherein the Ta layer is deposited to a thickness of about 3 nm.

5. The method as in claim 1 wherein the Ta layer is deposited to a thickness of about 3 nm and the Ru layer is deposited to a thickness of about 10 nm.

6. The method as in claim 1 wherein an end point detection method is used during the ion milling to determine when the layer of Ta has been removed and is terminated after the Ta has been removed.

7. The method as in claim 1 wherein Secondary Ion Mass Spectroscopy is used during ion milling to determine when the layer of Ta has been removed, and the ion milling is terminated after the layer of Ta has been removed.

8. The method as in claim 1 wherein the ion milling removes the Ta layer and a portion of the Ru layer.

9. The method as in claim 1 wherein the ion milling removes the Ta layer and about 2 nm of the Ru layer.

10. The method as in claim 1 further comprising, after performing an ion milling to remove the layer of Ta, and after defining the sensor structure, depositing an electrically insulating gap layer.

11. The method as in claim 1 further comprising, after performing an ion milling to remove the layer of Ta, and after defining the sensor structure, depositing an electrically conductive lead layer.

* * * * *